United States Patent [19]

Offner

[11] Patent Number: 4,693,569
[45] Date of Patent: Sep. 15, 1987

[54] METHOD AND APPARATUS FOR OPTICAL SYSTEM ADJUSTMENTS

[75] Inventor: Abe Offner, Darien, Conn.

[73] Assignee: The Perkin-Elmer Corporation, Norwalk, Conn.

[21] Appl. No.: 308,647

[22] Filed: Oct. 5, 1981

Related U.S. Application Data

[63] Continuation-in-part of Ser. No. 106,415, Dec. 21, 1979, Pat. No. 4,293,189, which is a continuation-in-part of Ser. No. 938,569, Aug. 31, 1978, abandoned, which is a continuation-in-part of Ser. No. 767,906, Feb. 11, 1977, abandoned.

[51] Int. Cl.$^4$ .......................... G02B 17/08; G02B 7/02
[52] U.S. Cl. .................................... 350/505; 350/442; 350/320
[58] Field of Search ............... 350/505, 504, 442, 443, 350/444, 445, 294, 320

[56] References Cited

U.S. PATENT DOCUMENTS 3,671,109  6/1972  Sugano et al. ...................... 350/442
3,721,488  3/1972  Kuhne ................................ 350/505

FOREIGN PATENT DOCUMENTS 126911  3/1959  U.S.S.R. .............................. 350/444

Primary Examiner—Jon W. Henry
Attorney, Agent, or Firm—Francis L. Masselle; Edwin T. Grimes; Thomas P. Murphy

[57] ABSTRACT

Described is a method and apparatus for adjustment of an image-forming optical system to correct for manufacturing and assembly defects by providing a pair of refractive elements symmetrically disposed about the image plane or conjugate image plane of the system and mounted for translation and/or rotation about one or more of three orthogonal axes.

13 Claims, 3 Drawing Figures

METHOD AND APPARATUS FOR OPTICAL SYSTEM ADJUSTMENTS

RELATED APPLICATIONS

This application is a continuation-in-part of U.S. Pat. No. 4,293,189 issued Oct. 6, 1981 on copending application, Ser. No. 106,415 filed Dec. 21, 1979 which in turn is a continuation-in-part of Ser. No. 938,569 filed Aug. 31, 1978 and now abandoned, which in turn is a continuation-in-part of application, Ser. No. 767,906 filed Feb. 11, 1977 and now abandoned, all of the foregoing applications being assigned to the same assignee as the present invention.

BACKGROUND OF THE INVENTION

The present invention relates to optical systems for forming an image of an object with extremely high resolution such as, for example, optical projection systems used for exposing a semiconductor wafer to the image of a mask in microcircuit fabrication.

As perhaps in no other field than microcircuit optical lithography has the design of optical systems presented such a challenge and necessitated such innovative and unorthodox optical configurations to achieve the utmost in image fidelity. In U.S. Pat. No. 3,748,015 to A. Offner, there is described a catoptric system producing a restricted annular field. While the system is highly corrected against optical aberrations, the narrowness of the annular field is, of course, a disadvantage and to overcome this, Offner has devised optical systems comprising refractive elements which produce wider fields. Such optical systems are described and claimed in U.S. Pat. No. 4,293,186 issued Oct. 6, 1981 on co-pending application Ser. No. 106,415 filed Dec. 21, 1979, the contents of which are incorporated herein by reference.

Of equal importance with image quality in optical microlithography and perhaps more difficult to accomplish is the generation of images in which each image element occupies the same position, to within a few micro-inches, as the corresponding point in the object field. For example, a specific embodiment of the optical system shown in FIG. 10 of the aforementioned U.S. Pat. No. 4,293,186 designed with unit power and an instantaneous field of about five square centimeters can, with UV illumination in the range of 2400 to 2800 Angstroms, forms high contrast images of submicron features so that the instantaneous field (which is scanned across the image plane to effect wafer exposure) contains more than $10^8$ bits or picture elements. In the nominal system the magnification and distortion are such that each of these bits is in its desired location to an accuracy of less than one microinch. To achieve these results the projection system includes six reflecting surfaces and eight refracting surfaces. If each of these is fabricated to tolerances which are at the limit of the present state of the art and the system is aligned as well as can be assured, it can be shown that a considerable degradation of the contrast of the imagery and intolerable changes in relative locations of the images over the field are to be expected due to the limits of achievable accuracy in the manufacture of components and in assembly and alignment thereof.

So, even as the need for near-perfection in the formation of images in the field of optical microlithography has pushed the lens designer's art to the utmost, so has the practical implementation of such designs in operative optical hardware imposed tolerances in the fabrication, assembly and alignment of optical elements which are practically impossible to meet in volume production. Thus, it is of little consequence that the theoretical design of an optical system is capable of diffraction limited performance and of reproducing printed circuits with line widths and/or line spacings of one micron or less when the magnification of the system may depart from nominal by intolerable amounts, i.e., a few parts per million, due to incorrect spacing between elements or inaccurate measurements of parameters of the optical components.

It is to this problem that the present invention is directed and it is a general object of that invention to provide a method of, and means for, relaxing the tolerances on the manufacture of optical components and on their assembly and alignment in the production of apparatus for projection optical microlithography and other optical systems requiring similar degrees of precision in operation.

SUMMARY OF THE INVENTION

To the accomplishment of the foregoing and other objects which will become apparent as this description proceeds, the present invention contemplates a method of correcting an image forming optical system for deviations from theoretical design performance resulting from errors in its optical components and/or in their assembly and alignment. The method comprises incorporating in the system a pair of refractive elements disposed in optical symmetry about an image plane or conjugate image planes of the system; displacing said elements rotationally about and/or in translation along one or more of three orthogonal axes; and selecting the character, extent and direction of displacement to eliminate or minimize the deviation or deviations.

The invention further contemplates an optical image projection system which enables or facilitates the employment of the above described method. The projection system comprises light-deviating components so spaced with respect to an optical axis as to form an image of an object, said components including a pair of refractive elements disposed in optical symmetry about an image plane or conjugate image planes and mounted for translational displacement along and/or rotational displacement about one or more of three orthogonal axes, said displacement being such in character, direction and extent as to correct the system for deviations from theoretical design performance resulting from manufacturing errors in said components and errors in their assembly and alignment.

DETAILED DESCRIPTION OF THE PREFERRED EMBODIMENTS

Figure 1:
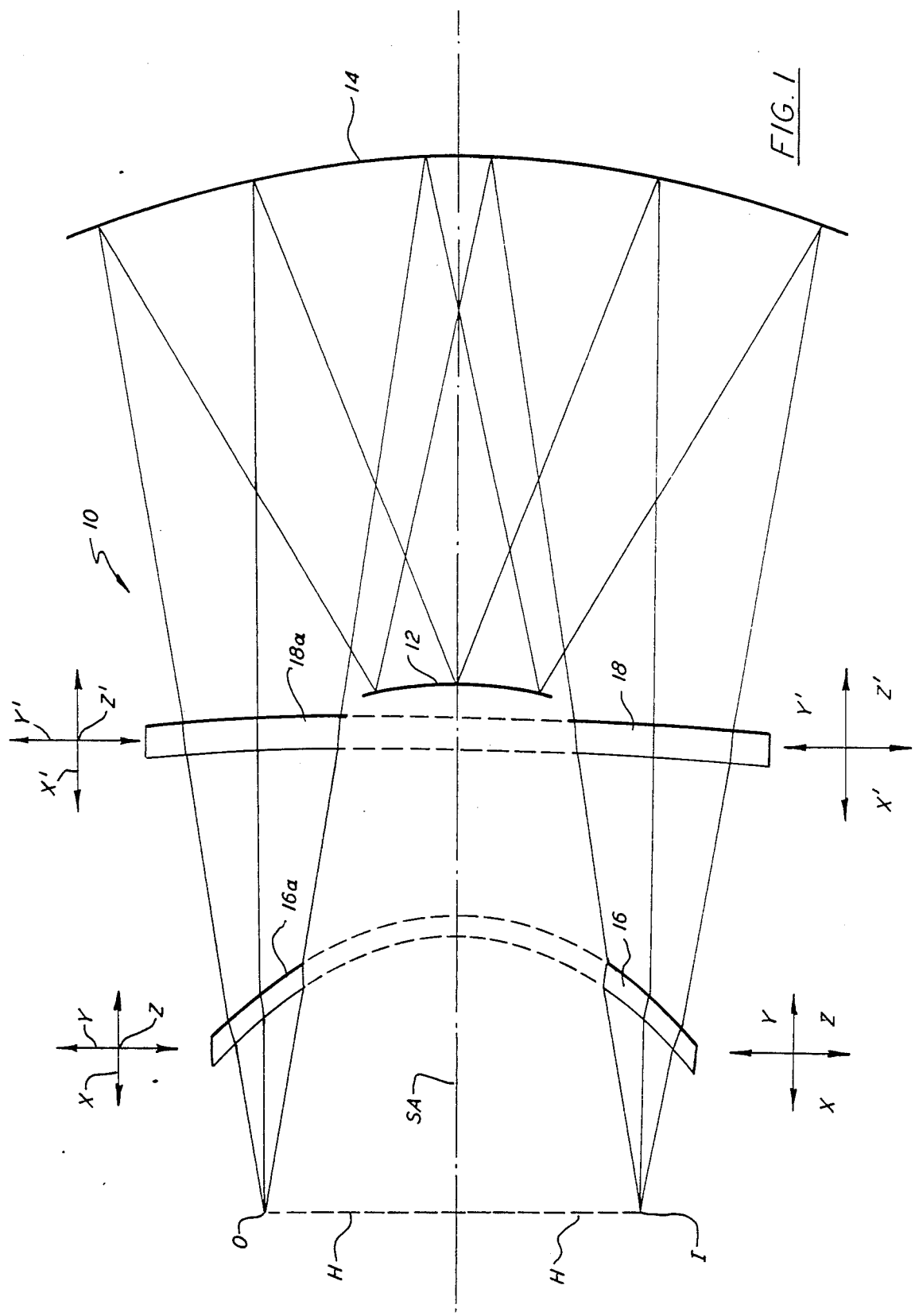
FIG. 1 is a schematic representation of an optical system, constructed in accordance with the concepts of the present invention.

While the invention is of general applicability, it will be described for purposes of example in conjunction with the type of optical projection systems described and claimed in aforementioned U.S. Pat. No. 4,293,186, one embodiment of which is shown in FIG. 1 wherein it is designated in its entirety by reference numeral 10. System 10 comprises two spherical mirrors, a convex mirror 12 and a concave mirror 14, the convex mirror being smaller in lateral dimensions and having a shorter radius of curvature than the concave mirror.

Mirrors 12, 14 are arranged in confronting relation with their respective centers of curvature on the system axis SA so as to produce three reflections within the system, which has off-axis conjugate areas centered at points O and I. The points O and I fall on an annulus centered on, and are on opposite sides of, the reference axis SA, and are spaced a distance H therefrom. As thus far described, the optical system shown in FIG. 1 is of the general type described and claimed in the aforementioned Offner U.S. Pat. No. 3,748,015 and particularly the embodiment illustrated in FIG. 2 thereof.

In accordance with the present invention a pair of refractive elements is disposed in optical symmetry with respect to an image plane or conjugate image planes and mounted for translational displacement along and/or rotational displacement about one or more of three orthogonal axes. The term "optical symmetry" (or "optically symmetrical") is used herein to denote the condition where the optical elements with respect to which it is used occupy corresponding positions of symmetry in the optical path; the term does not exclude physical symmetry, i.e., elements which are described as optically symmetrical may be physically symmetrical as well. Unless foreclosed by the context, "symmetry" and "symmetrical" are used throughout this specification in the optical sense.

In the FIG. 1 embodiment, the refractive elements take the form of identical menisci 16, 16a interposed between convex mirror 12 and the conjugate planes passing through O and I. Elements 16, 16a are suitably mounted in any conventional manner, such as with mechanical bearings, flexure pivots or the like to permit precisely-controlled, minute displacements in translation and/or rotation about at least one of three orthogonal axes indicated by vectors X, Y and Z in FIG. 1 adjacent the respective elements.

It will be appreciated that the location of the displacement axes is subject to judicious selection. Thus, for example, axis X which is shown to be parallel to system axis SA can be coincident therewith or it can pass through the respective menisci. A combination of rotations and displacements, of course, makes possible any desired positional shifting of the refractive elements to achieve the desired correction as will be explained presently by means of specific examples.

As previously mentioned, the optical system depicted in FIG. 1 is shown by way of example as a particular and preferred embodiment of the present invention and corresponds to the system shown in FIG. 1 of aforementioned U.S. Pat. No. 4,293,186. Accordingly, system 10 includes a second pair of refractive elements, of lower power than 16, 16a, which may take the form of menisci 18, 18a positioned close to and in some cases, if desired, coinciding with convex mirror 12. As fully described in U.S. Pat. No. 4,293,186, elements 16, 16a and 18, 18a are utilized therein to introduce longitudinal chromatic aberration for the purposes of compensating for the effects of variation of Petzval sum with wavelength in annular field optical systems. For that particular purpose, elements 16, 16a are identical, nearly concentric menisci, the convex radius of each of which is longer than the concave and the axial thickness greater than the difference between the convex and concave radii.

As highly corrected annular field optical systems of this type represent a primary field of application of the present invention, it has been selected, and will be used throughout this description, for the purposes of example in describing illustrative embodiments of the present invention. Accordingly, elements 16, 16a and 18, 18a may sometimes hereinafter be referred to as "strong shells" and "weak shells" respectively, but it will be understood that this is merely for literary ease and is not intended to limit the application of the present invention. Moreover, it should be understood that, while for the purposes of the invention described and claimed in U.S. Pat. No. 4,293,186 (wherein it is referred to as a "color trimming" plate or element), the weak shell may be a plane parallel plate, this is not the case with respect to the present invention for reasons which will become apparent presently.

Thus it will be understood that for the purposes of the present invention, strong shells 16, 16a need not be nearly concentric menisci but may be fully concentric or may take the form of other refractive optical elements. Elements 16, 16a and 18, 18a are so shaped that their contributions to longitudinal aberrations are small while their contributions to lateral aberrations are either zero or equal and of opposite sense. Elements 16, 16a are positioned symmetrically about the entering and leaving conjugates of the optical system or about real or virtual images thereof.

Reverting to FIG. 1, as indicated by arrows X', Y', Z', elements 18, 18a may be mounted in a manner similar to 16, 16a so as to enable axial displacement along and/or rotational displacement about one or more of three orthogonal axes. However, relatively larger displacements of the weak shells 18, 18a are required than of strong shells 16, 16a to effect comparable amounts of correction; while it is conceivable that both elements 16, 16a and 18, 18a can be mounted for such displacement and utilized jointly, it is preferred that the strong shells be employed for adjustments in systems of the type shown.

The application of the inventive concepts to a specific commercial embodiment and particular examples of the nature and extent of correction which can be accomplished will now be described with continued reference to FIG. 2 wherein two optical system segments, 10 and 10', each of the general type shown in FIG. 1, are disposed in back-to-back relationship so that the object and image planes are superposed on one side of axis SA where an intermediate image is formed at a point 20, all as more particularly described in U.S. Pat. No. 4,293,186. Each of the optical system segments 10 and 10' comprise respective concave and convex mirror components 12, 14 and 12', 14' arranged as previously described. In order to provide access to the image and object locations, the conjugate distance of at least one of the two mirror components 12, 14 and 12', 14' is made unequal, i.e., the intermediate image distance to the two mirror component is made greater than the object and- /or image distances, to thereby space the final image I from the object O.

A pair of identical meniscus elements 16, 16' are symmetrically disposed about intermediate image location 20 and each individually mounted for rotational and translational displacement with respect to at least one of three orthogonal axes as already explained in conjunction with FIG. 1 and schematically indicated by arrows, X, Y and Z. As strong shells 16, 16' are identical and the exit pupil for one and the entrance pupil for the other are at infinity, their contributions to lateral aberrations are equal and opposite. Their combined contribution to third order spherical aberration is one-eighth of the residual spherical aberration of the entire system 10, 10'. Their combined contribution to third order astigmatism is approximately equal to the third order astigmatism of the entire system 10, 10'. On the object-image side of the axis SA (the upper side in FIG. 2) are provided a pair of identical weak shells 18 and 18' which serve as color trimming elements in systems corrected for the effect of chromatic variation of Petzval sum by the introduction of longitudinal chromatic aberration in accordance with U.S. Pat. No. 4,293,186.

Figure 2:
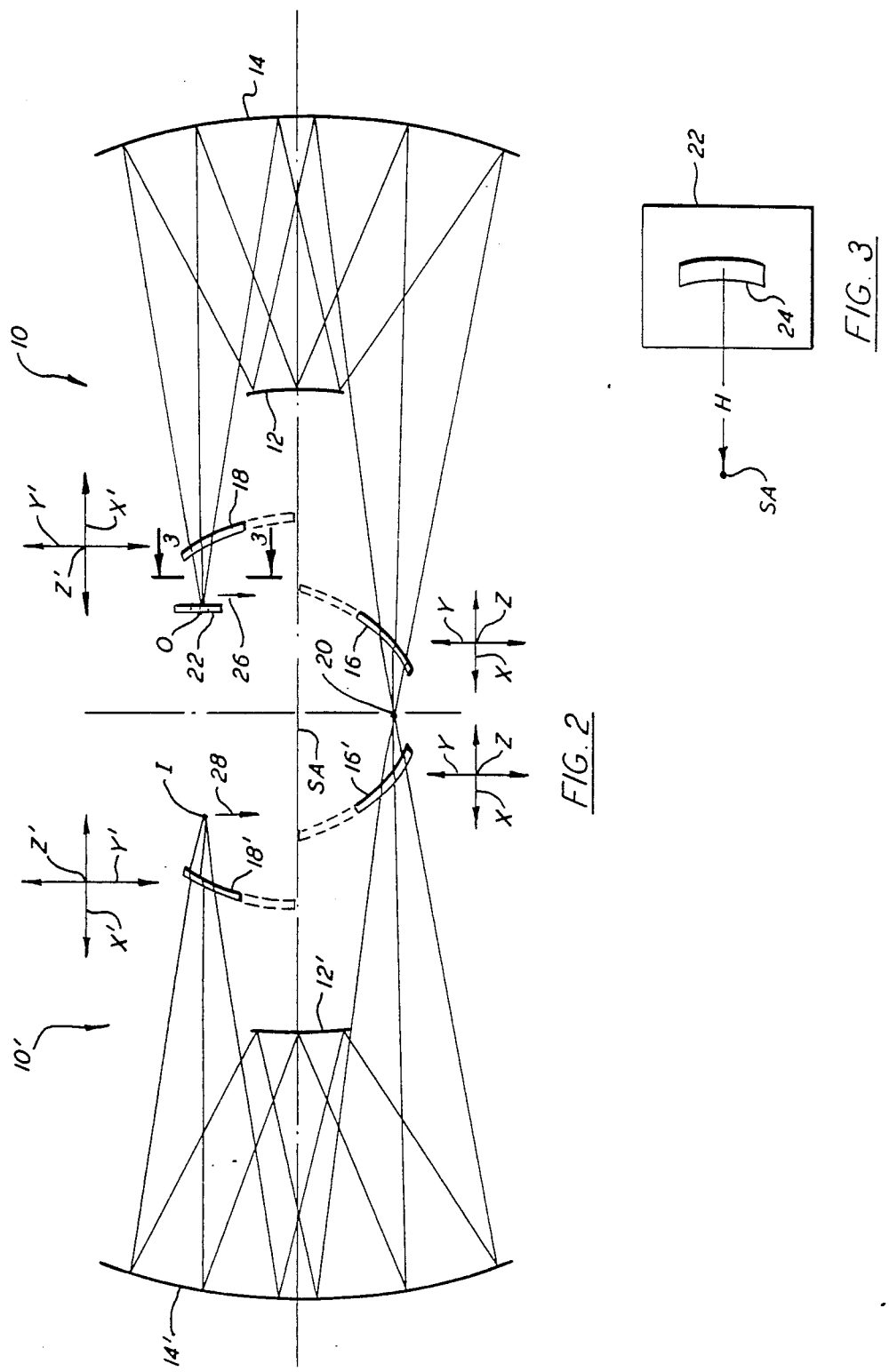
FIG. 2 is a schematic representation of a double optical system constructed in accordance with the concepts of the present invention, wherein two optical systems similar to the system of FIG. 1 are mounted in back-to-back relationship.

The construction data for a specific embodiment of the annular field optical system of FIG. 2 is given in the following table:

| RADIUS OF ANNULUS = 100 mm. | | | | |
|---|---|---|---|---|
| SURFACE NO. | RADIUS (mm.) | DISTANCE TO NEXT SURFACE (mm.) | MATERIAL | NOTE |
| 0 | (PLANE) | 88.41 | AIR | OBJECT |
| 1 | −212.36 | 8.37 | FUSED SILICA | |
| 2 | −217.77 | 394.30 | AIR | |
| 3 | −539.26 | −271.74 | AIR | MIRROR |
| 4 | −264.45 | 271.74 | AIR | MIRROR |
| 5 | −539.26 | −476.12 | AIR | MIRROR |
| 6 | −128.55 | −6.68 | FUSED SILICA | |
| 7 | −123.91 | −220.54 | AIR | |
| 8 | 123.91 | −6.68 | FUSED SILICA | |
| 9 | 128.55 | −476.12 | AIR | |
| 10 | 539.26 | 271.74 | AIR | MIRROR |
| 11 | 264.45 | −271.74 | AIR | MIRROR |
| 12 | 539.26 | 394.30 | AIR | MIRROR |
| 13 | 217.77 | 8.37 | FUSED SILICA | |
| 14 | 212.36 | 88.41 | AIR | |
| 15 | (PLANE) | | | IMAGE |

The system specified in the foregoing Table is designed to be used in the spectral range 240 to 365 nanometers at a numerical aperture of 0.17 at both the object and the image.

Figure 3:
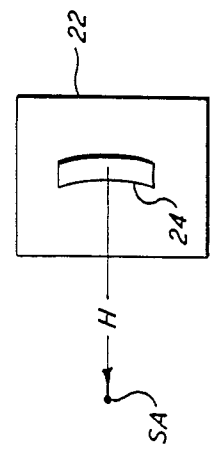
FIG. 3 is a fragmentary enlarged view of FIG. 2 as seen from line 3—3 looking in the direction of the arrows.

Optical system 10, 10' of FIG. 2 is of the restricted off-axis annular-field type employed in optical microlithography apparatus in which the restricted field is scanned across a wafer to effect its exposure to radiation formig an image of an exposure control mask placed at the object location O. More specifically, the mask is disposed in the object plane and the wafer in the image plane and both scanned synchronously. This is indicated schematically in FIG. 2 by an exposure field restriction element 22 (which may be considered the exposure control mask) containing a curved slit 24 of radius H having its center of curvature on optical axis SA, as shown in FIG. 3. Thus, the imagery is restricted to that portion of the object area which is exposed through slit 24. That portion of the object area will be imaged stigmatically into a similarly curved area in the image plane I. This occurs because all portions of the object and image that are in slit 24, or in the image of the slit, are at substantially the same distance H from the optical axis SA at which the system is corrected.

The mask could be provided in the image plane at I, or a mask could be provided in each plane, or the mask could be so positioned that the image thereof is in the image plane I. Further, when the system is used for effecting the exposure of photoresist-coated semiconductor wafers in a scanning mode, the object such as the photographic transparency or mask is moved past slit 24 in the direction indicated by arrow 26 so that a substantially unit power image of that portion of the object exposed by slit 24 is formed at I and moves past I in the direction indicated by arrow 28. As a result, if a wafer is placed at the image I and moves synchronously with the photographic transparency, it would be exposed to an image over its entire area.

An understanding of the scanning mode is relevant to comprehension of the present invention inasmuch as the latter enables the correction of deviations from theoretical performance stemming from mechanical imperfections in the scan motion as well as errors in the manufacture and alignment of optical components.

Following are examples of the various ways in which refractive element 16 and 16' may be employed to effect corrections of system 10, 10', FIG. 2.

1. An assembled optical system may have residual astigmatism due to incorrect spacings between optical components or inaccurately measured components. This can be eliminated by changing the separation of elements 16 and 16' while maintaining their symmetry about the intermediate image 20. This is accomplished by displacing elements 16 and 16' in opposite directions in translation along respective axes X, X parallel to SA. A spacing increase of 0.2 millimeters, effected by moving each element 0.1 mm. toward the respectively adjacent concave mirrors 14, 14' results in the focus of tangential lines being closer to the weak shells 18, 18' than the focus for radial lines by 6 micrometers.

2. The magnification of the system may depart from nominal due to incorrect spacing between elements or inaccurate measurements of the parameters of the optical components. A deviation of even a few parts per million is intolerable in high precision microlithography. Magnification errors can be corrected by moving elements 16 and 16' as a pair, i.e., jointly in the same direction, in translation along respective axes X, X parallel to axis SA. A displacement of 26 micrometers toward mirror 14 results in an increase of one micrometer in the size of a 127 millimeter dimension.

3. The performance of system 10, 10' as assembled may be characterized by astigmatism whose principal axes are not radial and tangential in all azimuths of the annular field. This may result from astigmatic figure of one or more of the optical components or decentrations or tilts of some of the components. For whatever reason, the aberration indicates that the system as assembled is not rotationally symmetrical. The problem can be corrected by decentering elements 16, 16' jointly in the appropriate direction. An example is the asymmetry introduced by an effective 0.06λ peak-to-valley astigmatism of the mirrors 12, 12' such that the radial power is greater. If the orientation of the astigmatism is such that the maximum power is radial at the center of slit 24, the result is 45° astigmatism with a difference of focus of five micrometers in azimuths 36° from the slit center. Displacing elements 16 and 16' in translation along parallel axes Y, Y orthogonal to axis SA by 0.140 mm. renders system performance indistinguishable from one which is rotationally symmetrical. An equivalent effect is achieved by rotating elements 16, 16' about axes parallel to the Z axis and passing through the shells at a distance H from the optical axis by 2.8 minutes of arc in a direction such as to move the centers of curvatures of the elements away from the optical axis.

4. There may be image rotation in the scanning system which results in the image not tracking in the scan direction, i.e., the images may be aligned at one end of the scan and laterally displaced at the other end. This may stem from misalignment of the optical system or mechanical imperfections in the scan motion. In either case it can be corrected by decentering the elements 16, 16' equally in opposite senses in the cross-scan direction. For example, if the strong shell on the object side (refractive element 16) is displaced in translation in the one direction along axis Y and the element (16') on the image side translated 25 micrometers in the opposite direction along axis Y, image rotation of $5.3 \times 10^{-6}$ radians or approximately one arc second results. The overlay error over a fifty-inch scan is $26 \times 10^{-6}$ inches.

5. Object points extending in a straight line in a cross-scan direction may, as a result of misalignment of the optical system, be imaged along a bowed line. This deviation from design performance can be corrected by decentering elements 16 and 16' by equal amounts in opposite senses along respective parallel axes X, X orthogonal to the system axis SA. For example, if element 16 is moved 25 micrometers away, and element 16' moved 25 micrometers toward, axis SA, a Y magnification bow of $5 \times 10^{-6}$ over a five inch span in a sense opposite to that of the curvature of scanning slit (24) image results. The same amount of Y-bow can be produced by tilting element 16 by 72 arc seconds so that its center is moved away from the optical axis and element 16' by 72 arc seconds so that its center of curvature is moved toward the optical axis. In this case the separation between the elements 16, 16' must be increased by moving each 0.43 mm. toward the respectively adjacent concave mirror in order to restore the astigmatic correction.

As previously mentioned, the weak shells (elements 18 and 18' in FIG. 2) may also be employed for effecting the corrections described albeit a proportionately greater displacement is required. Thus, in FIG. 2 the weak shells 18, 18' are placed symmetrically about the entering and leaving conjugates of the optical system. In this case also, the entrance and exit pupils of the system are at infinity and, consequently, making them identical results in equal contributions of opposite sense to the lateral aberrations. Their combined contribution to third order spherical aberration is about one-half the residual third order spherical aberration of the entire system. Their contribution to third order astigmatism is one-fifth the residual third order astigmatism of the entire system. The character and direction of displacement of the weak elements is the same as described above for the strong elements.

Although the invention has been shown and described with respect to preferred embodiments thereof and, in particular, with reference to annular field optical systems, it will be understood by those skilled in the art that various changes and omissions in the form and detail thereof may be made without departing from the spirit and scope of the invention which is to be limited solely by the subjoined claims.

What is claimed is:

1. An annular field optical system having a broad spectral range and including at least one pair of refractive elements, said optical system comprising:
a first half and a second half, each half including an optical system having an optical axis and defining conjugate image and object planes substantially normal to said axis, the first half and second half being coaxially disposed in back-to-back relationship so that the conjugate planes are superposed on at least one side of the optical system, and means for providing spaced object and final image locations on the other side of the optical system, said optical system being constructed and arranged so that the Petzval sum is substantially zero, said pair of refractive elements being disposed in optical symmetry about an image plane or conjugate image planes and mounted for translational displacement along and/or rotational displacement about one or more of three orthogonal axes, said orthogonal axes consisting of said optical axis and axes parallel or orthogonal thereto, said pair of refractive elements being identical, nearly concentric menisci, the convex radii of which are longer than the concave and axial thickness of which is greater than the difference between the convex and concave radii and so shaped that their contributions to longitudinal aberrations are small while their contributions to lateral aberrations are either zero or equal and of opposite sense, the displacement being such in character, direction and extent as to enable correction of the system for deviations from theoretical design performance resulting from manufacturing errors in the optical components of the system and in their assembly and/or alignment.

2. An annular field optical system according to claim 1, including a second pair of refractive elements optically symmetrically disposed about the conjugate image planes.

3. An annular field optical system according to claim 2, wherein said second pair of refractive elements are identical menisci.

4. A method of correcting an image-forming optical system for deviations from theoretical design performance resulting from errors in its optical components and/or in their assembly and asignment, comprising:
incorporating in the system a pair of refractive elements disposed about an image plane or conjugate image planes of the system;
displacing said elements rotationally about and/or in translation along one or more of three orthogonal, the deviation taking the form of, or including, astigmatism and the astigmatism correction is effected by translational displacement of said refractive elements in opposite directions along one of said axes constituting, or parallel to, the optical axis of the system.

5. A method according to claim 2 wherein the deviation takes the form of, or includes, astigmatism and the astigmatism correction is effected by translational displacement of said refractive elements in opposite directions along one of said axes constituting, or parallel to, the optical axis of the system.

6. A method according to claim 2 wherein the deviation takes the form of, or includes, a magnification error and correction is effected by translational displacement of both refractive elements in the same direction along one of said axes constituting or parallel to the optical axis of the system.

7. A method according to claim 4 wherein the deviation is in the nature of, or includes, rotation of the image and correction of the rotation is effected by translational displacement of said refractive elements and in opposite directions along respective parallel axes orthogonal to the optical axis of the system.

8. A method according to claim 4 wherein the deviation is in the nature of, or includes, astigmatism whose principal axes are not radial and tangential in all azimuths of the field and correction is effected by translational displacement of said refractive elements and in the same direction along respective parallel axes orthogonal to the optical axis of the system.

9. A method according to claim 4 wherein said elements are identical menisci and the deviation is in the nature of, or includes, astigmatism whose principal axes are not radial and tangential in all azimuths of the field and correction is effected by rotating said menisci about parallel axes orthogonal to said optical axis in a sense such as to displace their centers of curvature in the same direction with respect to optical axis of the system.

10. A method according to claim 4 wherein said elements are optically identical and displacement, regardless of character, extent or direction, is of equal amount.

11. A method of correcting a scanned annular field image-forming optical system for deviations from theoretical design performance resulting from errors in its scan motion and/or optical components or in the assembly or alignment of such components and causing object points in a straight line in the cross-scan direction to be imaged along a bowed line, comprising:
  incorporating in the system a pair of identical menisci disposed about an image plane or conjugate image plane of the system; and
  displacing one of said menisci away and the other toward the optical axis of the system along respective parallel axes orthogonal to said optical axis by a distance sufficient to cause such object points to be imaged along a substantially straight line.

12. A method of correcting a scanned annular field image-forming optical system for deviations from theoretical design performance resulting from errors in its scan motion and/or optical components or in the assembly and alignment of said components and causing object points in a straight line in the cross-scan direction to be imaged along a bowed line, comprising:
  incorporating in the system a pair of identical menisci disposed about an image plane or conjugate image plane of the system;
  tilting one of said menisci about an axis orthogonal to the optical axis of the system so that its center of curvature is moved toward said optical axis and tilting the other menisci about an axis parallel to said orthogonal axis so that its center of curvature is moved away from said optical axis, the amount of rotation being sufficient to cause such object points to be imaged in a substantially straight line; and
  displacing said menisci in opposite directions along an axis parallel to said optical axis so as to change the distance therebetween sufficiently to eliminate astigmatism, including astigmatism introduced by tilting of the menisci.

13. An annular field optical system comprising:
  a pair of generally identical segments, each having an optical axis, the segments being disposed in back-to-back relationship with said axes aligned, to form a reference axis for the system with conjugate planes superposed on one side of the aligned axes;
  each segment including a two-mirror component consisting of a concave mirror and a convex mirror in confronting relation, said mirrors being disposed with respective centers of curvature on said reference axis and substantially coincident, said segments forming an intermediate image at the location of said superposed conjugate planes, the distance from the intermediate image to a respective two-mirror component being greater than the distance from the other conjugate location to that two-mirror component in at least one of said segments to thereby space the object and final image locations one from the other on the other side of said reference axis;
  said optical system being constructed and arranged so that the Petzval sum is substantially zero and includes refracting means for balancing the effects of the variation in said Petzval sum due to variation in color by introducing axial chromatic aberration of the opposite sense, whereby the positions of focus at the annular field portions of the conjugate planes remain substantially constant;
  said balancing means consisting of a pair of identical meniscus elements symmetrically disposed about said intermediate image location, each said meniscus element being nearly concentric and having a convex radius larger than its concave radius and a thickness greater than the difference between its convex and concave radius, and a pair of identical color-trimming elements, each consisting of a meniscus of lower power than said first-mentioned menisci symmetrically disposed with respect to the object and final image locations;
  the meniscus elements of at least one of said pairs being individually mounted for translational displacement along and/or rotational displacement about one or more of three orthogonal axes, said displacement being such in character, direction and extent as to enable correction of the system for deviations from theoretical design performance resulting from manufacturing errors in said components and/or errors in said assembly and/or alignment.

* * * * *